United States Patent
Yoo et al.

(10) Patent No.: US 12,328,633 B2
(45) Date of Patent: Jun. 10, 2025

(54) METHOD AND DEVICE FOR HANDLING LINK FAILURE IN WIRELESS COMMUNICATION SYSTEM

(71) Applicant: SAMSUNG ELECTRONICS CO., LTD., Suwon-si (KR)

(72) Inventors: Seungbo Yoo, Suwon-si (KR);
Hyungtaig Lim, Suwon-si (KR);
Hwajin Cha, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 245 days.

(21) Appl. No.: 17/864,739

(22) Filed: Jul. 14, 2022

(65) Prior Publication Data
US 2022/0353776 A1    Nov. 3, 2022

Related U.S. Application Data

(63) Continuation of application No. PCT/KR2021/000409, filed on Jan. 12, 2021.

(30) Foreign Application Priority Data

Jan. 14, 2020    (KR) .................... 10-2020-0005058

(51) Int. Cl.
*H04W 36/30*    (2009.01)
*H04W 36/00*    (2009.01)

(52) U.S. Cl.
CPC ..... *H04W 36/305* (2018.08); *H04W 36/0058* (2018.08); *H04W 36/0022* (2013.01); *H04W 36/00698* (2023.05)

(58) Field of Classification Search
CPC ..... H04W 60/02; H04W 4/02; H04W 72/542; H04W 36/00692; H04W 76/18;
(Continued)

(56) References Cited

U.S. PATENT DOCUMENTS 11,206,707 B2    12/2021    Deogun et al.
11,228,974 B2 *   1/2022    Park .................. H04W 52/0229
(Continued)

FOREIGN PATENT DOCUMENTS

CN    105659688 A    6/2016
CN    110022588       7/2019
(Continued)

OTHER PUBLICATIONS

European Office Action dated Mar. 25, 2024 for EP Application No. 21741349.1.
(Continued)

*Primary Examiner* — Jung Liu
(74) *Attorney, Agent, or Firm* — Nixon & Vanderhye P.C.

(57) ABSTRACT

The disclosure relates to a 5$^{th}$ generation (5G) or pre-5G communication system for supporting higher data transfer rates than 4$^{th}$ generation (4G) communication systems such as long term evolution (LTE). According to various embodiments of the disclosure, a method for operating a base station in which a Master Cell Group (MCG) is configured in a wireless communication system may include: detecting a failure of a Primary Cell (PCell) of a Secondary Cell Group (SCG) (PScell), transmitting inter-Radio Access Technology (RAT) measurement configuration information to a terminal based on the detection, and transmitting information on a cell identified based on the measurement configuration information to a base station in which the SCG is configured.

8 Claims, 9 Drawing Sheets

(58) Field of Classification Search
CPC . H04W 28/0215; H04W 48/06; H04W 72/52; H04W 60/00; H04W 4/023; H04W 8/183; H04W 56/001; H04W 56/002; H04W 74/0833; H04W 72/51; H04W 4/90; H04W 8/005; H04W 48/12; H04W 74/004; H04W 8/06; H04W 48/18; H04W 76/15; H04W 72/0453; H04W 4/50; H04W 76/10; H04L 5/0007; H04J 3/1694; H04B 17/318
See application file for complete search history.

(56) References Cited

U.S. PATENT DOCUMENTS

| | | | |
|---|---|---|---|
| 11,310,715 B2* | 4/2022 | Kim | H04W 36/0085 |
| 2012/0266811 A1* | 10/2012 | Nakamura | G03G 21/0035 118/258 |
| 2013/0260745 A1* | 10/2013 | Johansson | H04W 36/144 455/423 |
| 2015/0124748 A1 | 5/2015 | Park et al. | |
| 2016/0261396 A1* | 9/2016 | Jeong | H04W 72/0453 |
| 2018/0124612 A1 | 5/2018 | Babaei et al. | |
| 2018/0160458 A1* | 6/2018 | Wu | H04W 76/19 |
| 2018/0288778 A1* | 10/2018 | Heo | H04W 76/19 |
| 2019/0182881 A1* | 6/2019 | Teyeb | H04L 5/001 |
| 2020/0169906 A1 | 5/2020 | Tsuboi et al. | |
| 2021/0266811 A1 | 8/2021 | Hwang et al. | |

FOREIGN PATENT DOCUMENTS

| | | |
|---|---|---|
| EP | 3 668 145 A1 | 6/2020 |
| JP | 2019-033419 A | 2/2019 |
| KR | 10-2019-0138704 | 12/2019 |
| KR | 10-2020-0000283 | 1/2020 |
| WO | WO 2019/031216 A1 | 2/2019 |
| WO | 2019/101162 | 5/2019 |
| WO | WO 2019/101162 A1 | 5/2019 |

OTHER PUBLICATIONS

International Search Report for PCT/KR2021/000409 mailed Apr. 12, 2021, 5 pages.
Written Opinion of the ISA for PCT/KR2021/000409 mailed Apr. 12, 2021, 4 pages.
3GPP TSG-RAN2#108, "Support of dormancy SCG", Apr. 18-Nov. 22, 2019, 6 pages.
3GPP TS 38.331 V15.8.0, $3^{rd}$ Generation Partnership Project; Technical Specification Group Radio Access Network; NR; Radio Resource Control (RRC) protocol specification, Dec. 2019, 532 pages.
Extended European Search Report dated Mar. 31, 2023 for EP Application No. 21741349.1.
India Office Action dated Feb. 25, 2025 for IN Application No. 202217046040.
CN Office Action dated Apr. 26, 2025 for CN Application No. 202180009409.8.

* cited by examiner

METHOD AND DEVICE FOR HANDLING LINK FAILURE IN WIRELESS COMMUNICATION SYSTEM

CROSS-REFERENCE TO RELATED APPLICATIONS

This application is a continuation of International Application No. PCT/KR2021/000409 designating the United States, filed on Jan. 12, 2021, in the Korean Intellectual Property Receiving Office and claiming priority to Korean Patent Application No. 10-2020-0005058, filed on Jan. 14, 2020, in the Korean Intellectual Property Office, the disclosures of which are incorporated by reference herein in their entireties.

BACKGROUND

Field

The disclosure relates, in general, to a wireless communication system, and, for example, to an apparatus and method for handling a link failure in the wireless communication system.

Description of Related Art

To meet a demand on wireless data traffic which has been in an increasing trend after a $4^{th}$ Generation (4G) communication system was commercialized, there is an ongoing effort to develop an improved $5^{th}$ Generation (5G) communication system or a pre-5G communication system. For this reason, the 5G communication system or the pre-5G communication system is called a beyond 4G network communication system or a post Long Term Evolution (LTE) system.

To achieve a high data transfer rate, the 5G communication system is considered to be implemented in an mmWave band (e.g., such as a 60 GHz band). To reduce a propagation path loss at the mmWave band and to increase a propagation delivery distance, beamforming, massive Multiple Input Multiple Output (MIMO), Full Dimensional MIMO (FD-MIMO), array antenna, analog beam-forming, and large scale antenna techniques are under discussion in the 5G communication system.

In addition, to improve a network of a system, techniques such as an evolved small cell, an advanced small cell, a cloud Radio Access Network (RAN), an ultra-dense network, Device to Device (D2D) communication, a wireless (CoMP), and reception interference cancellation, or the like are being developed in the 5G communication system.

In addition thereto, hybrid Frequency shift keying and Quadrature Amplitude Modulation (FQAM) and Sliding Window Superposition Coding (SWSC) as an Advanced Coding Modulation (ACM) technique and Filter Bank Multi Carrier (FBMC), Non Orthogonal Multiple Access (NOMA), and Sparse Code Multiple Access (SCMA), or the like as an advanced access technology are being developed in the 5G system.

An effective communication service may be provided in a multiple-connection system in which base stations and a terminal are coupled through independent radio access technologies. With the introduction of the multiple-connection system, there is a need for a method of handling a link failure (e.g., a Radio Link Failure (RLF)) when the link failure occurs one cell group.

SUMMARY

Embodiments of the disclosure provide an apparatus and method for handling a link failure, when the link failure occurs in a wireless communication system.

Embodiments of the disclosure provide an apparatus and method for handling a failure when failure information on a cell group is received in a wireless communication system.

Embodiments of the disclosure provide an apparatus and method for managing a link failure through handling for a cell and bearer of a base station in an environment in which a plurality of cell groups are configured in a wireless communication system.

According to various example embodiments of the disclosure, a method of operating a base station in which a Master Cell Group (MCG) is configured in a wireless communication system may include: detecting a failure of a Primary Cell (PCell) of a Secondary Cell Group (SCG) (PScell), transmitting inter-Radio Access Technology (RAT) measurement configuration information to a terminal, based on the detection, and transmitting information on a cell identified based on the measurement configuration information to a base station in which the SCG is configured.

According to various example embodiments of the disclosure, a base station in which an Master Cell Group (MCG) is configured in a wireless communication system may include: at least one transceiver, and at least one processor. The at least one processor may be configured to: detect a failure of a Primary Cell (PCell) of a Secondary Cell Group (SCG) (PScell), control the base station to transmit inter-Radio Access Technology (RAT) measurement configuration information to a terminal, based on the detection, and control the base station to transmit information on a cell identified based on the measurement configuration information to a base station in which the SCG is configured.

According to various example embodiments of the disclosure, a method of operating a base station in which a Secondary Cell Group (SCG) is configured in a wireless communication system may include: detecting a failure of a Primary Cell (PCell) of a Secondary Cell Group (SCG) (PScell), identifying a cell, based on the detection, and performing a connection procedure with a terminal by transmitting information on the cell to a base station in which an MCG is configured.

An apparatus and method according to various example embodiments of the disclosure may detect a link failure and control the failure, thereby providing effective communication performance when operating multiple-connectivity.

Advantages of the disclosure are not limited to the aforementioned advantages, and other advantages not mentioned herein may be clearly understood by those skilled in the art to which the disclosure pertains from the following descriptions.

BRIEF DESCRIPTION OF THE DRAWINGS

The above and other aspects, features and advantages of certain embodiments of the present disclosure will be more apparent from the following detailed description, taken in conjunction with the accompanying drawings, in which.

DETAILED DESCRIPTION

Figure 1:
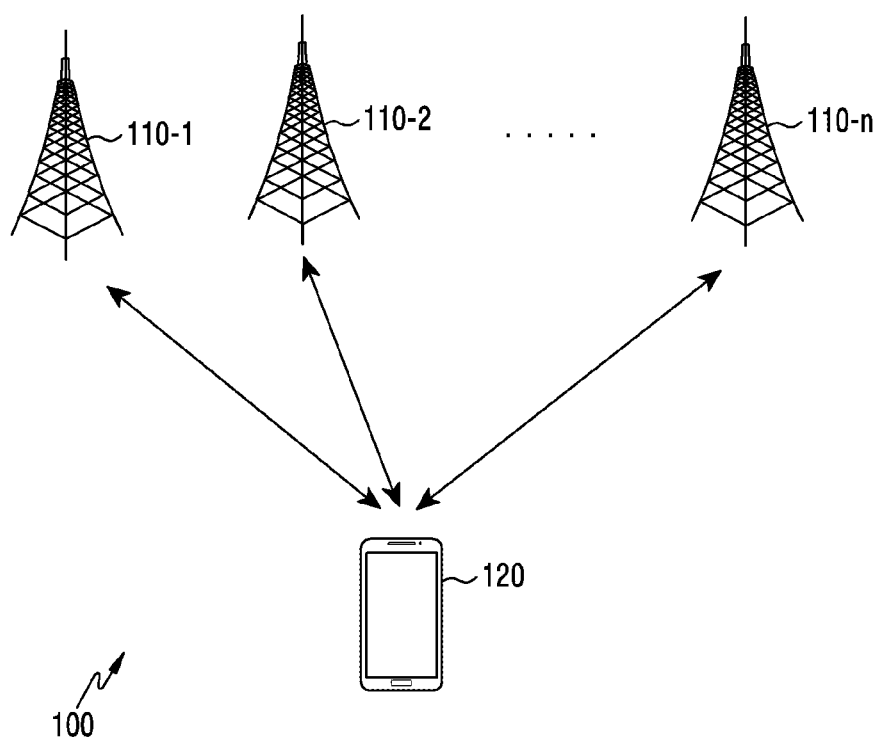
FIG. 1 is a diagram illustrating an example wireless communication system according to various embodiments.

Terms used in the disclosure are for the purpose of describing various embodiments only and are not intended to limit other embodiments. A singular expression may include a plural expression unless there is a contextually distinctive difference. All terms (including technical and scientific terms) used herein have the same meaning as commonly understood by those ordinarily skilled in the art disclosed in the disclosure. It will be further understood that terms, such as those defined in commonly used dictionaries, should be interpreted as having a meaning that is consistent with their meaning in the context of the relevant art, and will not be interpreted in an idealized or overly formal sense unless expressly so defined herein. Terms defined in the disclosure should not be interpreted to exclude the embodiments of the disclosure.

A hardware-based approach is described for example in the various embodiments of the disclosure described hereinafter. However, since the various embodiments of the disclosure include a technique in which hardware and software are both used, a software-based approach is not excluded in the embodiments of the disclosure.

Hereinafter, the disclosure relates to an apparatus and method for managing a link failure in a wireless communication system. For example, the disclosure describes a technique for controlling and processing a link failure for a cell group in the wireless communication system, in a multiple-connectivity environment of the wireless communication system.

Terms used hereinafter in relation to multiple connectivity (e.g., Dual Connectivity (DC), Multi-Radio Access Technology (RAT) (MR)-DC, a cell group, a Master Cell Group (MCG), a Secondary Cell Group (SCG)), terms referring to a signal (e.g., a reference signal, system information, a control signal, a message, data), and terms referring to network entities (e.g., a communication node, a radio node, a radio unit, a network node, a Master Node (MN), a Secondary Node (SN), a Transmission/Reception Point (TRP), a Digital Unit (DU), a Radio Unit (RU), a Massive MIMO Unit (MMU)) or the like are used by way of non-limiting example for convenience of explanation. Therefore, the disclosure is not limited to the terms described below, and thus other terms having the same technical meaning may also be used.

In addition, although the disclosure describes various embodiments using terms used in some communication standards (e.g., 3$^{rd}$ Generation Partnership Project (3GPP)), this is for purposes of example only. Various embodiments of the disclosure may be easily modified and applied to other communication systems.

In embodiments of the disclosure, a metric regarding whether a condition (e.g., a measurement report condition) is satisfied and regarding channel quality of a signal for a measurement parameter may use at least one of various parameters. As the channel quality, Reference Signal Received Power (RSRP), Beam Reference Signal Received Power (BRSRP), Reference Signal Received Quality (RSRQ), Received Signal Strength Indicator (RSSI), Signal to Interference and Noise Ratio (SINR), Carrier to Interference and Noise Ratio (CINR), SNR, Error Vector Magnitude (EVM), Bit Error Rate (BER), Block Error Rate (BLER), other terms having equivalent technical meanings, or other metrics indicating the channel quality may be used.

FIG. 1 is a diagram illustrating an example wireless communication system 100 according to various embodiments. In FIG. 1, base stations 110-1, 110-2, . . . , 110-n and a terminal 120 are illustrated by way of non-limiting example as some of nodes using a radio channel in the wireless communication system. The base stations 110-1, 110-2, . . . , 110-n may be coupled to the terminal 120 through multiple connectivity (e.g., Dual Connectivity (DC)). Hereinafter, for convenience of description, a common description for each of the base stations 110-1, 110-2, . . . , 110-n may be described by being referred to as the base station 110.

The base stations 110-1, 110-2, . . . , 110-n are network infrastructures which provide radio access to the terminal 120. The base station 110 has coverage defined as a specific geographical area, based on a distance capable of transmitting a signal. The term 'coverage' used hereinafter may refer, for example, to a service coverage area in the base station 110. The base station 110 may cover one cell, or may cover multiple cells. Herein, the multiple cells may be divided by a supported frequency and an area of a covered sector.

In addition to the term 'base station', the base station 110 may be referred to as an 'Access Point (AP)', an 'eNodeB (eNB)', a '5th Generation (5G) node', a '5G NodeB (NB)', a 'next generation Node B (gNB)', a 'wireless point', a 'Transmission/Reception Point (TRP)', a 'Distributed Unit (DU)', a 'Radio Unit (RU)', a Remote Radio Head (RRH), or other terms having equivalent technical meanings. According to various embodiments, the base station 110 may be coupled to at least one TRP. The base station 110 may transmit a downlink signal or receive an uplink signal with respect to the terminal 120 through the at least one TRP.

As a device used by a user, the terminal 120 communicates with the base station 110 through the radio channel. The terminal 120 may be operated without user involvement. For example, as a device for performing Machine Type Communication (MTC), the terminal 120 may not be carried by the user. In addition to the term 'terminal', the terminal 120 may be referred to as a 'User Equipment (UE)', a 'mobile station', a 'subscriber station', a 'Customer Premises Equipment (CPE)', a 'remote terminal', a 'wireless terminal', an 'electronic device', a 'vehicle terminal', a 'user device', or other terms having equivalent technical meanings.

A Dual Connectivity (DC) technology may refer, for example, to one type of multiple-connectivity technologies introduced from the 3rd Generation Partnership Project (3GPP) standard release 12. In the DC technology, a terminal is simultaneously coupled to two independent heterogeneous or homogeneous wireless communication cell groups having a separate radio resource control entity, and a frequency resource on a component carrier of a cell in each cell group located in a different frequency band is used for signal transmission/reception to increase frequency use efficiency of the terminal and a base station. The DC includes a master cell group in which a control plane is directly coupled to a core network to manage a radio resource control state of the terminal and a secondary cell group associated with the master cell group.

A Carrier Aggregation (CA) technology may refer, for example, to a technology introduced in the 3GPP standard release 10. In the CA technology, the terminal is coupled to a homogenous wireless communication cell group having a common radio resource control entity, and a frequency resource on a component carrier of each cell located in a different frequency band is used for signal transmission/reception to increase frequency use efficiency of the terminal and the base station.

Due to technical advantages of increasing efficiency in using limited wireless communication resources of the terminal and base station, the DC technology and the CA technology are actively studied in academic terms. In particular, a 5G mobile communication system uses a non-stand alone type in which an operation is achieved in association with a 4G core network as a basic operation scheme, which is utilized as a core technology in a commercial service supporting the 5G mobile communication system.

In various embodiments of the disclosure, a situation in which the base stations 110-1, 110-2, . . . , 110-n are coupled to the terminal 120 through multiple connectivity is described. As described above, the multiple connectivity refers to a communication technology in which the terminal 210 is coupled to each of the base stations 110-1, 110-2, . . . , 110-n through an independent Radio Access Technology (RAT). For example, the terminal 120 may be coupled to each of two base stations through Dual Connectivity (DC) which is one type of the multiple connectivity. For example, the terminal 120 may be coupled to an eNB base station through Long Term Evolution (LTD), and may be coupled to a gNB base station through New Radio (NR). Each base station may be referred to as a communication node. One or more cells provided in one base station may be referred to as a cell group. For example, the base station may support one or more cell groups. A base station which provides a Master Cell Group (MCG) may provide a Master Node (MN), and a base station which provides a Secondary Cell Group (SCG) may provide a Secondary Node (SN). In various embodiments, a relationship between base stations and cell groups may be defined variously. According to an embodiment, one base station may provide one cell group. In addition, according to another embodiment, one base station may provide one or more cell groups. A specific relationship will be described below with reference to FIG. 2A and FIG. 2B. In addition, according to an embodiment, each base station may perform Carrier Aggregation (CA). In this case, the terminal may perform the CA with respect to the base station through cells of each cell group.

In various embodiments of the disclosure, the multiple connectivity may be configured alone or the CA may be configured together with the multiple connectivity. The disclosure provides a base station apparatus and method for performing an operation of controlling transmit power of a terminal in a distributed manner on a real-time basis and an operation of controlling the transmit power of the terminal in the distributed manner on a non-real-time basis. Cell groups of the multiple connectivity may be respectively referred to as a first cell group, a second cell group, . . . , an M-th cell group. In the disclosure, the first cell group may be replaced with a primary cell group or master cell group of the multiple connectivity, and the second cell group, . . . , the M-th cell group may be replaced with a secondary cell group.

Figure 2A:
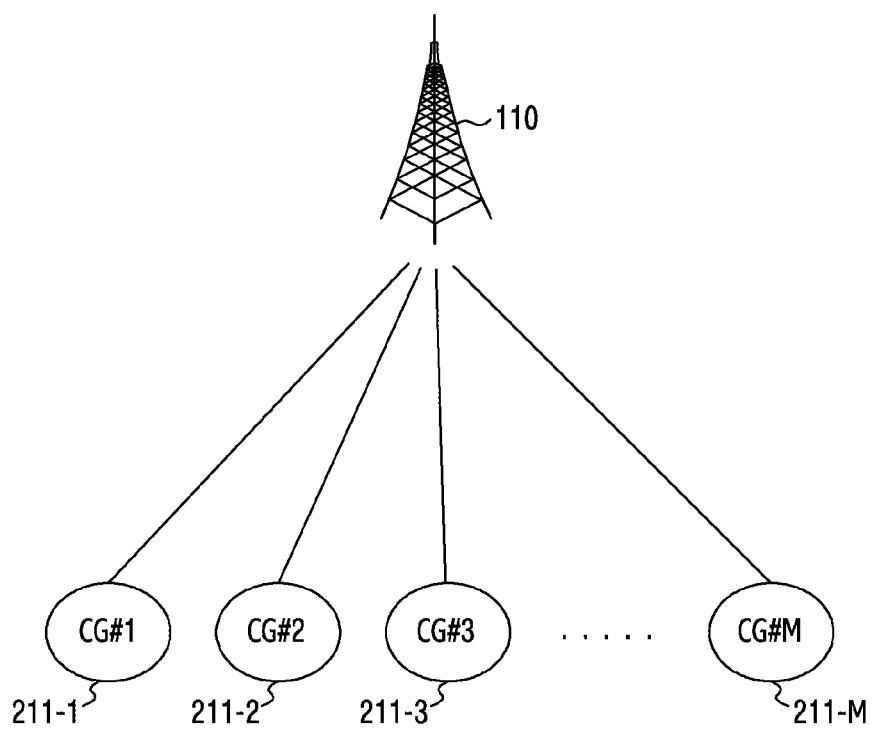
FIG. 2A is a diagram illustrating an example of cell groups in a wireless communication system according to various embodiments.

FIG. 2A is a diagram illustrating an example of cell groups in a wireless communication system according to various embodiments. The wireless communication system of FIG. 2A is an example of a situation in which one base station manages all cell groups.

Referring to FIG. 2A, the base station 110 may provide a plurality of cell groups 211-1, 211-2, 211-3, . . . , 211-M to a terminal. Each of the plurality of cell groups may include one or more cells. Although it is described in FIG. 2A that one base station manages all cell groups, the disclosure is not limited thereto. In various embodiments, a separate network entity coupled to the base station may perform a link failure management procedure described below.

Figure 2B:
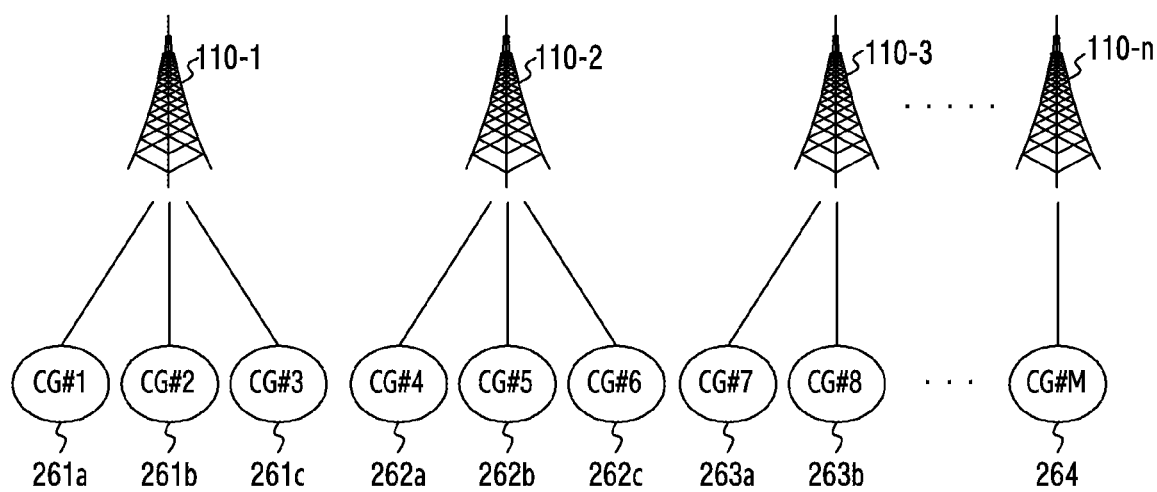
FIG. 2B is a diagram illustrating an example of cell groups in a wireless communication system according to various embodiments.

FIG. 2B is a diagram illustrating another example of cell groups in a wireless communication system according to various embodiments. The wireless communication system of FIG. 2B is an example of a situation in which at least two base stations manage all cell groups. The at least two base stations may include the base stations 110-1, 110-2, . . . , 110-n.

Referring to FIG. 2B, the base stations 110-1, 110-2, . . . , 110-n may each provide a plurality of cell groups 261a, 261-b, 261c, 262a, 262b, 262c, 263a, 263b, 264 to a terminal. In this case, the number of cell groups coupled to the base station may be variously configured for each base station. For example, the first base station 110-1 may provide three cell groups (e.g., a CG #1 261a, a CG #2 261b, and a CG #3 261c) to the terminal. The second base station 110-2 may provide three cell groups (e.g., a CG #4 262a, a CG #5 262b, and a CG #6 262c) to the terminal. The third base station 110-3 may provide two cell groups (e.g., a CG #7 263a and a CG #8 263b) to the terminal. The N-th base station 110-n may provide one cell group (e.g., a CG #M 264) to the terminal. Each of the plurality of cell groups may include one or more cells.

Although it is described in FIG. 2B that the plurality of base stations manage all of the cell groups, the disclosure is not limited thereto. In various embodiments, a separate network entity coupled to the plurality of base stations may perform a link failure management procedure described below.

In a multiple connectivity (e.g., Dual Connectivity (DC)) situation in which a homogeneous or heterogeneous RAT is provided, a problem may occur in a wireless situation for an MCG or SCG. When a radio link fails in a cell of the MCG or SCG (e.g., when a Radio Link Failure (RLF) occurs), an optimized recovery may be required under the control of the base station.

When a failure occurs in the MCG or SCG, a node which manages a cell group may receive failure information from a node in which the failure occurs. In this case, a receiving node needs to manage recovery and other processing operations, based on the failure information. That is, a method for handling the link failure in an MN for the MCG or an SN for the SCG is required. Hereinafter, although an entity which manages the MCG is described as the MN and an entity which manages the SCG is described as the SN, an embodiment implemented with a CU-DU structure (or including a DU-RU structure) having a distributed deployment is not excluded, in addition to a base station as a single entity. According to an embodiment, the MN which manages the MCG may include a Central Unit (CU)-Control Plane (CP), a CU-User Plane (UP), and a Distributed Unit (DU). The SM which manages the SCG may include the CU-CP, the CU-UP, and the DU. Hereinafter, a multiple-connectivity situation in which a terminal is simultaneously coupled to the MCG/SCG is described. The terminal may be coupled to one or more SCGs.

According to a target for which a link failure occurs and a subject which handles this, an operation type may be divided into four scenarios as follows.
(1) Method in which MN handles SCG failure
(2) Method in which SN handles SCG failure
(3) Method in which SN handles MCG failure
(4) Method in which MN handles MCG failure The SCG failure may refer, for example, to a situation in which an RLF occurs in a cell of the SCG. When the SCG failure occurs, a PCell of the SCG, that is, a PSCell, is not suitable to perform communication, and this may be a situation which requires recovery through another node (e.g., MN). Hereinafter, operations are described based on the scenarios (1) and (2), but unless otherwise specified, the same or similar processing method may also be applied to the scenarios (3) and (4). That is, the operations of the scenarios (1) and (3) of handling a failure occurring in a counterpart CG differ only in a Network Entity (NE) name, and basic operational specifications are the same (when there is a difference in some parts, it is specified separately). The operations of the scenarios (3) and (4) of handling a failure occurring in its own CG differ only in the NE name, and basic operational specifications are the same (when there is a difference in some parts, it is specified separately).

Figure 3:
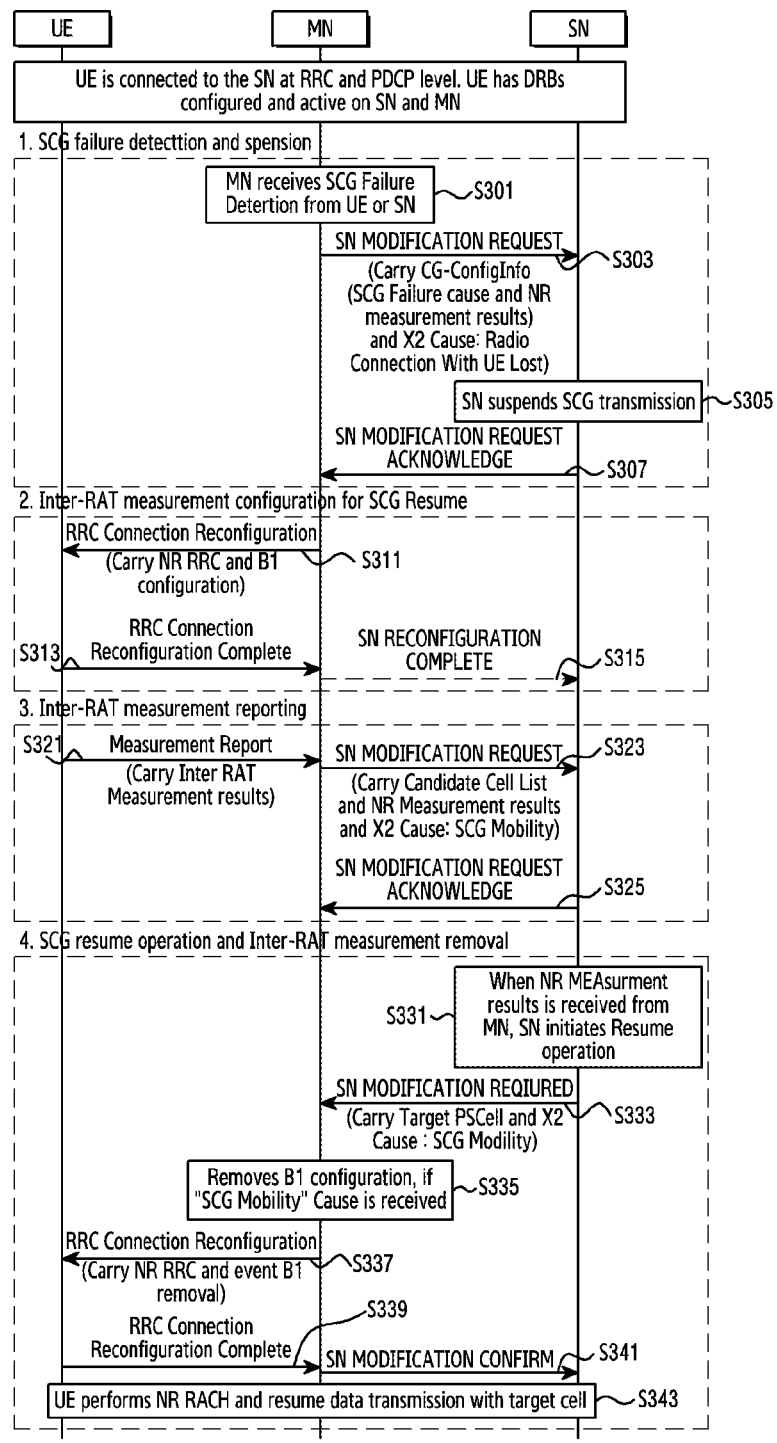
FIG. 3 is a signal flow diagram illustrating an example of signaling for controlling a link failure in a Master Node (MN) in a wireless communication system according to various embodiments.

FIG. 3 is a signal flow diagram illustrating an example of signaling for controlling a link failure in a Master Node (MN) in a wireless communication system according to various embodiments. In FIG. 3, operations between the MN, SN, and UE, performed by the MN for handling an SCG failure when occurred, are described.

Referring to FIG. 3, it is a situation in which multiple connectivity is achieved in the UE. The UE may be coupled to the MN and the SN. The UE may be coupled to Data Radio Bearers (DRBs) activated in the MN and the SN. The UE may be coupled to the SN at a Radio Resource Control (RRC)/Packet Data Convergence Protocol (PDCP) level.

1. SCG Failure Detection And Suspension

The MN may detect an SCG failure and inform the SN of information on the detected SCG failure. In this case, the SN may suspend transmission of the SCG. An example procedure is as follows.

In operation S301, the MN may detect the SCG failure. The MN may receive information on the SCG failure (hereinafter, SCG failure information) from the UE, or may receive the SCG failure information from the SN. The MN may detect the SCG failure by obtaining the SCG failure information. The MN may detect that an RLF occurs in a cell of the SCG. The MN may receive the SCG failure information from a counterpart node or receive the SCG failure information from the UE.

In operation S303, the MN may transmit information on the SCG failure to the SN. This information may be transmitted in the form of a modification request message. The MN may transmit the modification request message to the SN. The modification request message may include cell group configuration information (CG-ConfigInfo) or an X2 cause. The CG-ConfigInfo may include information on an SCG failure cause and a measurement result (e.g., an NR measurement result). The X2 cause may indicate that it is not possible to find a UE connection (e.g., Radio Connection With UE lost).

In operation S305, the SN may suspend SCG transmission. The SN may recognize the failure in the SCG by receiving information on the SCG failure from the MN. The SN may autonomously detect the failure in the SCG. Upon detecting the SCG failure, the SN suspends transmission of the SCG. In operation S307, the SN may transmit a modification request response to the MN. It may be optionally transmitted to the MCG by including NR RRC to change a UL path.

2. Inter-RAT Measurement Configuration For SCG Resume

The MN may transmit the measurement configuration to the UE for resumption of the SCG connection.

An example procedure is as follows. In operation S311, the MN may configure the measurement. To configure the measurement, the MN may transmit an RRC connection reconfiguration message to the UE. To resume the SCG, the MN may transmit an inter-RAN measurement configuration to the UE. To configure a UL path change configuration requested by the SN, NR RRC information may be optionally transmitted together to the UE. In operation S313, the UE may transmit an RRC connection reconfiguration complete message to the MN. In operation S315, the MN may transmit the reconfiguration complete message to the SN.

3. Inter-RAT Measurement Reporting

The MN may configure the SN, based on a measurement report received from the UE. When the UE satisfies a criterion in which the inter-RAT measurement is configured (e.g., when a reporting criterion is satisfied (e.g., channel quality greater than or equal to a threshold)), the UE may transmit a measurement result (e.g., measured cell information) to the MN base station. The MN may specify a target SN and SCG, based on a corresponding report, and transmit the measured cell information to a new target SN through SN modification or an SN addition procedure for the existing target SN. A specific procedure is as follows.

In operation S321, the UE may transmit a measurement report to the MN. In this case, the measurement report may include a measurement result. The measurement result may include an inter-RAT measurement result. The measurement result may include a measurement result depending on a measurement configuration configured through operation S311. In operation S323, the MN may transmit an SN modification request message to the SN, based on the measurement report. According to an embodiment, the SN modification request message may include information on at least one cell (e.g., a candidate cell list), information on a measurement result (e.g., an NR cell measurement result), and X2 cause information. The X2 cause information may indicate SCG mobility. In operation S325, the MN may receive a response for the SN modification request from the SN.

4. SCG Resume Operation And Inter-RAT Measurement Removal

The SN may resume the SCG connection, based on the obtained measurement information (e.g., operation S321).

The SN performs an access procedure with the UE through a target PScell (PCell of SCG), based on the measured cell information. The MN may release the inter-RAT measurement configuration if it comes with a specific cause when receiving the SN modification request. The UE performs the access procedure including a random access procedure through the received reconfiguration message, and resumes data transmission/reception. A specific procedure is as follows.

In operation S331, the SN may perform a resume procedure. As a typical cell access procedure, the SN may initiate a radio connection recovery procedure through the random access procedure. In operation S333, the SN may transmit information related to the resume procedure to the MN. For example, the SN may transmit to the MN an SN modification required message for the UE. The information related to the resume procedure may include a cell (e.g., an ID of the PSCell) used when the SN is coupled to the UE. In addition, the information related to the resume procedure may include an X2 cause (SCG mobility) which is a cause of information transfer. Optionally, the SN may transmit NR RRC including UL path information to the MN to recover the UL path. In operation S335, the MN may remove the measurement configuration, based on the request of the SN. The MN may identify that the cause transferred from the SN indicates 'SCG mobility'. Upon identifying that the cause indicates the "SCG mobility", the MN may remove a pre-set measurement configuration (e.g., B1 configuration). In opeation S5337, the MN may transmit an RRC connection reconfiguration message to the UE. For the RRC connection reconfiguration message, a message including a configuration removal (e.g., B1 removal) may be transmitted to the UE. In this case, the RRC connection reconfiguration message may include an NR RRC configuration (information transmitted by an SN as an NR base station to the MN for UE configuration) together in an embodiment. In operation S339, the UE may transmit an RRC connection reconfiguration message complete to the MN. In operation S341, the MN may transmit an SN modification confirm message to the SN. In operation S343, the UE may be coupled to a target cell of the SCG through a Physical Random Access Channel (PRACH) procedure (e.g., an NR PRACH in an E-UTRA-NR-Dual Connectivity (EN-DC) situation).

Although operations of respective nodes are described by way of non-limiting the UE, each process for recovering the SCG failure may operate individually. For example, an inter-node operation of a procedure may be applied as an individual embodiment, and unnecessary operations may be omitted in various embodiments.

When the SCG failure occurs in the SN, instead of performing the recovery procedure through RRE autonomously by the SN, a more reliable recovery procedure may be performed through signaling with the MN and signaling of the MN and UE. For example, even if an RLF occurs in a gNB in an EN-DC situation, the UE may be coupled to a PSCell of the gNB through signaling between the eNB and the UE. The PSCell of the gNB may be reliably coupled to the UE through a more reliable RRC reconfiguration procedure with the eNB. As another example, a situation in which one gNB and another gNB are coupled through DC may be considered. The MN may be a gNB providing a serving cell of a Frequency Range #1 (FR1), and the SN may be a gNB providing a serving cell of a Frequency Range #2 (FR2). In case of the FR2, the RLF may occur frequently due to a high frequency band. In this case, since an operation is performed at a relatively low frequency domain, an SCG resume procedure may be performed for a gNB of the FR2 through signaling between the UE and the gNB for providing a reliable connection.

Meanwhile, the signaling of FIG. 3 may be performed in the same or similar manner not only when the SCG of the SN fails but also when the MCG of the MN fails. According to an embodiment, when an RLF occurs in a gNB which is an MN in an NR-E-UTRA-Dual Connectivity (NE-DC) situation, an eNB which is an SN may perform a recovery procedure with the UE. In addition, according to an embodiment, when an RLF occurs in a cell of an eNB which is an MN in the EN-DC situation, a gNB which is an SN may perform a recovery procedure with the UE. Since the RLF occurrence may be caused not by simple channel quality deterioration but also a factor (e.g., a configuration failure, an environmental change around a corresponding base station, a malfunction of the base station, or the like) caused by a specific node, the failure of the SCG or MCG may be effectively corrected by performing a recovery procedure through another node.

In various embodiments, the UE may not store measurement configuration information which is set in the SCG, when the SCG failure occurs. In various situations for the MR-DC such as the EN-DC situation or the DC situation between FR1-FR2 or the like, when an RLF occurs in the SN, the UE may be configured not to store any more setting for a corresponding cell. For example, since the UE does not consider a setting related to the SN, it may not be easy to find a new cell (NR). Therefore, the UE may receive measurement configuration information of RAT for the SN (inter-RAT measurement configuration information of an eNB) through a reconfiguration procedure with another node (eNB). The UE may perform measurement for a PSCell of the SN, based on a control of the MN. According to various embodiments, when an RLF occurs in a specific node, measurement configuration information is provided under the control of another node, and based on this, a connection is established again with the specific node, thereby reducing a situation in which a connection recovery procedure is delayed due to a limitation of the UE.

Figure 4:
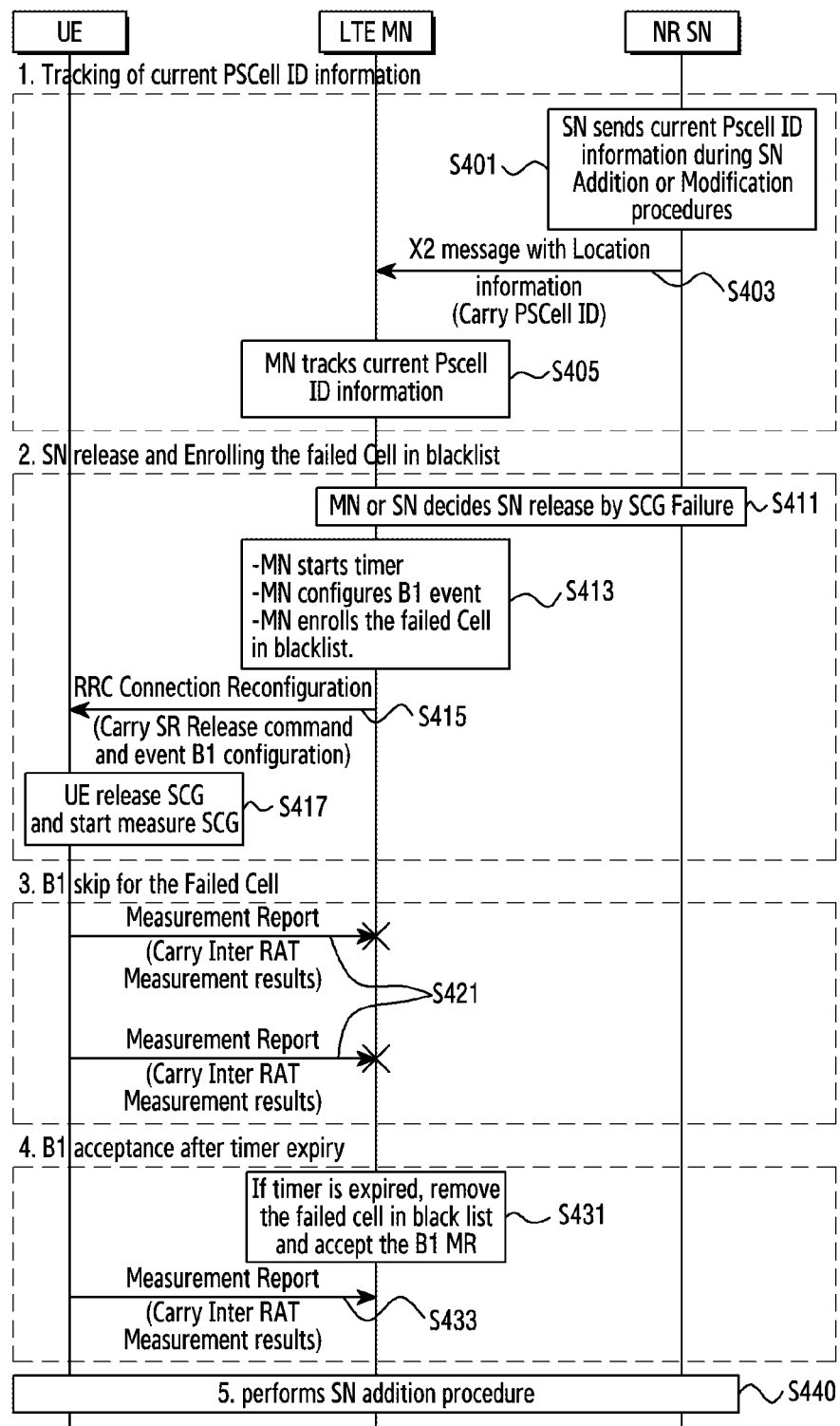
FIG. 4 is a signal flow diagram illustrating an example of signaling for blacklisted cell management in an MN in a wireless communication system according to various embodiments.

FIG. 4 is a signal flow diagram an example of signaling for blacklisted cell management in an MN in a wireless communication system according to various embodiments. Based on a blacklist (measurement prohibition), operations between the MN, SN, and UE, performed by the MN for handling an SCG failure when occurred, are described.

Referring to FIG. 4, FIG. 4 illustrates an example situation in which multiple connectivity is achieved in the UE. The UE may be coupled to the MN and the SN. The MN is an LTE base station (or LTE MN), and the SN is an NR base station (or NR SN). The UE may be coupled to a plurality of base stations through EN-DC.

1. Tracking Of Current PSCell Information

The MN may manage cell information of the SN, that is, SCG cell information. The MN may identify PScell information of the SCG, by tracking information on a cell of the SCG. An example procedure may be as follows.

In operation S401, the SN may identify cell information of the SN. The cell information of the SN may be information on the cell of the SCG of the SN. In operation S403, the SN may transmit the SCG cell information to the MN. The cell information may include information on a PSCell which is a Pcell of the SCG. In various embodiments, the SN may identify information of the PScell coupled to a current UE in an initial access and may transmit this to the MN. In addition, in various embodiments, the SN may identify information of the PScell coupled to the current UE whenever the PScell changes and may transmit this to the MN. In addition, in various embodiments, the SN may identify information of the PScell coupled to the current UE when a predefined event is satisfied and may transmit this to the MN. In addition, in various embodiments, the SN may identify information of the PScell coupled to the current UE periodically and may transmit this to the MN. In operation S405, the MN may identify information of a cell of the SCG (PSCell). In various embodiments, the MN may detect an SCG failure by tracking the cell information of the SCG.

2. SN Release Enrolling The Failed Cell In Blacklist

After detecting the SCG failure, the MN may release the SCG. In this case, the MN may manage a corresponding connection by enrolling to the blacklist a cell in which the SCG is detected and by operating a timer. An example procedure may be as follows.

In operation 411, an RLF of the SCG may occur in the SN. Due to the SCG failure, an SN release is performed. In various embodiments, the MN may detect the SCG failure. In some other embodiments, the SN may detect the SCG failure. When the SCG failure is detected and when it is an SN-initiated SN release, a specific cause is transmitted to the MN to notify that it is a situation of a release caused by the SCG failure.

In operation 413, the MN may identify the SCG failure. The MN may configure a measurement report event (e.g., B1 event). The configuring of the measurement report event may refer, for example, to configuring of parameters including a predetermined (e.g., specified) condition in measurement reporting in which a measurement result is transmitted to a base station, when a UE satisfies a predetermined condition. The MN according to various embodiments may enroll to the blacklist a cell in which a failure is detected. Even if a measurement report for the cell enrolled to the blacklist is received, the MN may be configured to ignore the measurement report.

In operation S415, the MN may perform the SN release. The MN may perform the SN release caused by the SCG failure. The MN may transmit a message for the SN release, e.g., an RRC connection reconfiguration message, to the UE. The RRC connection reconfiguration message may include an SN release command. The RRC connection reconfiguration message may include an inter-RAT measurement configuration (e.g., B1 event configuration).

In operation 417, the MN may detect the SCG failure, and may start a timer when an MN or SN-initiated SN release is performed. The timer may be a timer configured for a cell in which the SCG failure occurs. The MN may enroll to the blacklist a PSCell of the SCG in which a failure occurs, until the timer expires. Although it is illustrated that operation 417 is performed after operation 415, the two operations may be performed independently/in parallel.

In operation S419, the UE may receive an RRC connection reconfiguration message from the MN. The UE may identify an SN release command. The UE may perform an SN release. The UE may identify a B1 event configuration. The UE may perform measurement for the SCG, based on an inter-RAT measurement configuration (e.g., B1 event configuration).

3. B1 Skip For The Failed Cell

In operation S421, the UE performs measurement, and when a configured condition (e.g., measurement report: B1 event) is satisfied, the UE may transmit a measurement result to the MN. When channel quality (e.g., RSRP, RSRQ) satisfies a condition in which inter-RAT B1 measurement is configured (e.g., entering condition—above threshold, leaving condition—below threshold), the UE may transmit measured cell information to the MN base station. Even if a measurement report corresponding to the blacklist is received, the MN may ignore this while a timer is running That is, since it is before the timer expires, when the measurement result includes a measurement result for a cell enrolled to the blacklist (e.g., a PSCell in which an RLF has occurred), the UE may ignore the measurement result for the PSCell.

4. B1 Acceptance After Timer Expiry

In operation S431, the timer may expire. When the timer expires, the MN may remove the PCell of the SCG, that is, the PSCell, included in the blacklist. In operation S433, the MN may receive a measurement report for a corresponding cell of the UE. In operation S440, the MN may perform an SN addition procedure, based on the measurement report.

Although example operations of respective nodes are described in detail in FIG. 4 to describe operations between the MN, the SN, and the UE, each process for recovering the SCG failure may operate individually. For example, the operation between the nodes of the procedure may be applied as an individual embodiment, and unnecessary operations may be omitted in various embodiments. For example, according to when the measurement report is received, after operation S421, the MN may perform operation S440.

In addition, although the operation S440 is described in FIG. 4 as a procedure performed by the MN to establish a connection with the UE, signaling between the MN and the SN may be defined as a specific operation of the MN and SN. For example, the signaling may be illustrated by way of example by operations S323 and S325 of FIG. 3.

When the SCG failure occurs in the SN, instead of performing the recovery procedure through RRE autonomously by the SN, a more reliable recovery procedure may be performed through signaling with the MN and signaling of the MN and UE. For example, even if an RLF occurs in a gNB in an EN-DC situation, the eNB may configure a B1 event, and based on this, may perform measurement reporting with the UE. In addition, the eNB may operate a timer and a blacklist, so that the UE is coupled to a PSCell of the gNB. The gNB may be reliably coupled to the UE through a more reliable RRC reconfiguration procedure with the eNB. As another example, a situation in which one gNB and another gNB are coupled through DC may be considered. The MN may be a gNB providing a serving cell of a Frequency Range #1 (FR1), and the SN may be a gNB providing a serving cell of a Frequency Range #2 (FR2). In case of the FR2, the RLF may occur frequently due to a high frequency band. In this case, since an operation is performed at a relatively low frequency domain, cell measurement information may be configured for a gNB of the FR2 through signaling between the UE and the gNB for providing a reliable connection. According to a measurement result based on the measurement configuration information, the gNB of the FR1 may perform an SCG resume procedure for the FR2.

Meanwhile, the signaling of FIG. 4 is performed may be the same or similar manner not only when the SCG of the SN fails but also when the MCG of the MN fails. According to an embodiment, when an RLF occurs in a gNB which is an MN in an NE-DC situation, an eNB which is an SN may perform a recovery procedure with the UE. In addition, according to an embodiment, when an RLF occurs in a cell of an eNB which is an MN in the EN-DC situation, a gNB which is an SN may perform a recovery procedure with the UE through the timer operation and the blacklist operation. Since the RLF occurrence may be caused not by simple channel quality deterioration but also a factor (e.g., a configuration failure, an environmental change around a corresponding base station, a malfunction of the base station, or the like) caused by a specific node, the failure of the SCG or MCG may be effectively corrected by performing a recovery procedure through another node.

In various embodiments, the UE may not store measurement configuration information which is set in the SCG, when the SCG failure occurs. In various situations for the MR-DC such as the EN-DC situation or the DC situation between FR1-FR2 or the like, the UE may not have capability of storing SCG information. That is, when an RLF occurs in the SN, the UE may be configured not to store any more setting for a corresponding cell. Since the UE is not able to consider a setting related to the SN, it may not be easy to find a new cell (NR). The UE may be required to obtain a measurement configuration for finding a new cell, through a reconfiguration procedure with another node (eNB). The UE may receive measurement configuration information of RAT for the SN (inter-RAT measurement configuration information of an eNB). The UE may perform measurement for a PSCell of the SN, based on a control of the MN. According to various embodiments, when an RLF occurs in a specific node, the UE obtains measurement configuration information from another node previously coupled, thereby solving a problem caused by limited capability of the existing UE.

Figure 5:
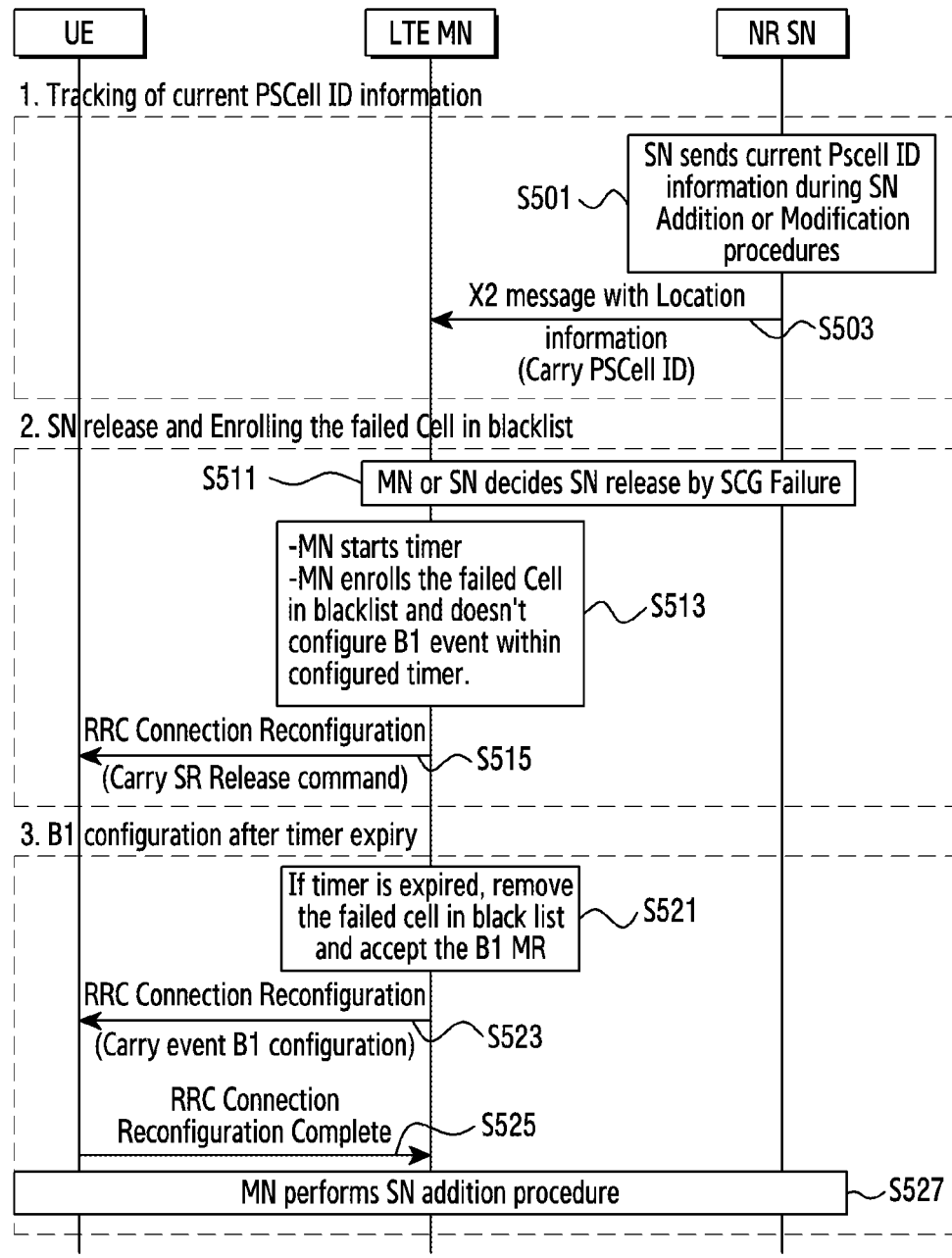
FIG. 5 is a signal flow diagram illustrating example of signaling for blacklisted cell management in an MN in a wireless communication system according to various embodiments.

FIG. 5 is a signal flow diagram illustrating example of signaling for blacklisted cell management in an MN in a wireless communication system according to various embodiments. Based on a blacklist (measurement prohibition), operations between the MN, SN, and UE, performed by the MN for handling an SCG failure when occurred, are described.

Referring to FIG. 5, it is a situation in which multiple connectivity is achieved in the UE. The UE may be coupled to the MN and the SN. The MN is an LTE base station (or LTE MN), and the SN is an NR base station (or NR SN). The UE may be coupled to a plurality of base stations through EN-DC.

Tracking Of Current PSCell ID Information

The MN may manage cell information of the SN, that is, SCG cell information. The MN may identify PSCell information of the SCG, by tracking information on a cell of the SCG. An example procedure may be as follows.

In operation S501, the SN may identify cell information of the SN. The cell information of the SN may be information on the cell of the SCG of the SN. In operation S503, the SN may transmit the SCG cell information to the MN. The cell information may include information on a PSCell which is a PCell of the SCG. In various embodiments, the SN may identify information of the PScell coupled to a current UE in an initial access and may transmit this to the MN. In addition, in various embodiments, the SN may identify information of the PScell coupled to the current UE whenever the PScell changes and may transmit this to the MN. In addition, in various embodiments, the SN may identify information of the PScell coupled to the current UE when a predefined event is satisfied and may transmit this to the MN. In addition, in various embodiments, the SN may identify information of the PScell coupled to the current UE periodically and may transmit this to the MN. The operation of the MN and SN corresponding to FIG. 4 may also be applied to the MN and SN of FIG. 5 in the same or similar manner.

SN Release And Enrolling The Failed Cell In Blacklist

After detecting the SCG failure, the MN may release the SCG. In this case, the MN may manage a corresponding connection by enrolling to the blacklist a cell in which the SCG is detected and by operating a timer. An example procedure may be as follows.

In operation 511, an RLF of the SCG may occur in the SN. Due to the SCG failure, an SN release is performed. In various embodiments, the MN may detect the SCG failure. In some other embodiments, the SN may detect the SCG failure. When the SCG failure is detected and when it is an SN-initiated SN release, a specific cause is transmitted to the MN to notify that it is a situation of a release caused by the SCG failure.

In operation 513, the MN may identify the SCG failure, and may start a timer when an MN or SN-initiated SN release is performed. Herein, the timer may be a timer configured for a cell in which the SCG failure occurs. The MN may enroll to a blacklist a PSCell of the SCG in which a failure occurs, until the timer expires. Meanwhile, unlike in FIG. 4, the MN may not configure a measurement report event (e.g., inter-RAT event (e.g., B1 event)). That is, the MN may perform the SN release without having to configure an event for measurement report triggering.

In operation S515, the MN may perform the SN release. The MN may perform the SN release caused by the SCG failure. The MN may transmit a message for the SN release, e.g., an RRC connection reconfiguration message, to the UE. The RRC connection reconfiguration message may include an SN release command. The UE may receive an RRC connection reconfiguration message from the MN. The UE may identify an SN release command. The UE may perform an SN release.

B1 Configuration After Timer Expiry

In operation S521, the timer may expire. When the timer expires, the MN may configure an inter-RAT measurement configuration. In operation S523, the MN may transmit an RRC connection reconfiguration including the inter-RAT measurement configuration to the UE. In operation S525, the UE may transmit an RRC connection reconfiguration complete message to the MN. In operation S527, the MN may perform an SN addition procedure, based on the measurement report. For example, when channel quality (e.g., RSRP, RSRQ) satisfies a condition in which inter-RAT B1 measurement is configured (e.g., entering condition—above threshold, leaving condition—below threshold), the UE may transmit measured cell information to the MN base station. The MN may perform the SN addition procedure with the SN, based on a corresponding measurement report.

Although operations of respective nodes are described in detail with reference to FIG. 5 to describe operations between the MN, the SN, and the UE, each process for recovering the SCG failure may operate individually. That is, the operation between the nodes of the procedure may be applied as an individual embodiment, and unnecessary operations may be omitted in various embodiments.

In addition, although the operation S520 is described in FIG. 5 as a procedure performed by the MN to establish a connection with the UE, signaling between the MN and the SN may be defined as a specific operation of the MN and SN. For example, the signaling may be illustrated, by way of non-limiting example, by operations S323 and S325 of FIG. 3.

When the SCG failure occurs in the SN, instead of performing the recovery procedure through RRE autonomously by the SN, a more reliable recovery procedure may be performed through signaling with the MN and signaling of the MN and UE. For example, even if an RLF occurs in a gNB in an EN-DC situation, the eNB may operate a timer and a blacklist, so that the UE is coupled to a PSCell of the gNB. Thereafter, the eNB may configure a B1 event, and based on this, may perform measurement reporting with the UE. The gNB may be reliably coupled to the UE through a more reliable RRC reconfiguration procedure with the eNB. As another example, a situation in which one gNB and another gNB are coupled through DC may be considered. The MN may be a gNB providing a serving cell of a Frequency Range #1 (FR1), and the SN may be a gNB providing a serving cell of a Frequency Range #2 (FR2). In case of the FR2, the RLF may occur frequently due to a high frequency band. In this case, since an operation is performed at a relatively low frequency domain, cell measurement information may be configured for a gNB of the FR2 through signaling between the UE and the gNB for providing a reliable connection. According to a measurement result based on the measurement configuration information, the gNB of the FR1 may perform an SCG resume procedure for the FR2.

Meanwhile, the signaling of FIG. 5 may be performed in the same or similar manner not only when the SCG of the SN fails but also when the MCG of the MN fails. According to an embodiment, when an RLF occurs in a gNB which is an MN in an NE-DC situation, an eNB which is an SN may perform a recovery procedure with the UE. In addition, according to an embodiment, when an RLF occurs in a cell of an eNB which is an MN in the EN-DC situation, a gNB which is an SN may perform a recovery procedure with the UE through the timer operation and the blacklist operation. Since the RLF occurrence may be caused not by simple channel quality deterioration but also a factor (e.g., a configuration failure, an environmental change around a corresponding base station, a malfunction of the base station, or the like) caused by a specific node, the failure of the SCG or MCG may be effectively corrected by performing a recovery procedure through another node.

In various embodiments, the UE may be configured not to store measurement configuration information which is set in the SCG, when the SCG failure occurs. In case of the SCG failure, since the UE is not able to consider a setting related to the SN, it may not be easy to find a new cell (NR). Therefore, the UE may perform measurement for the PSCell of the SN, based on control signaling of the MN (an RRC message including the inter-RAT measurement configuration). According to various embodiments, when an RLF occurs in a specific node, the UE obtains measurement configuration information from another node previously coupled, thereby solving a problem caused by limited capability of the existing UE.

Figure 6:
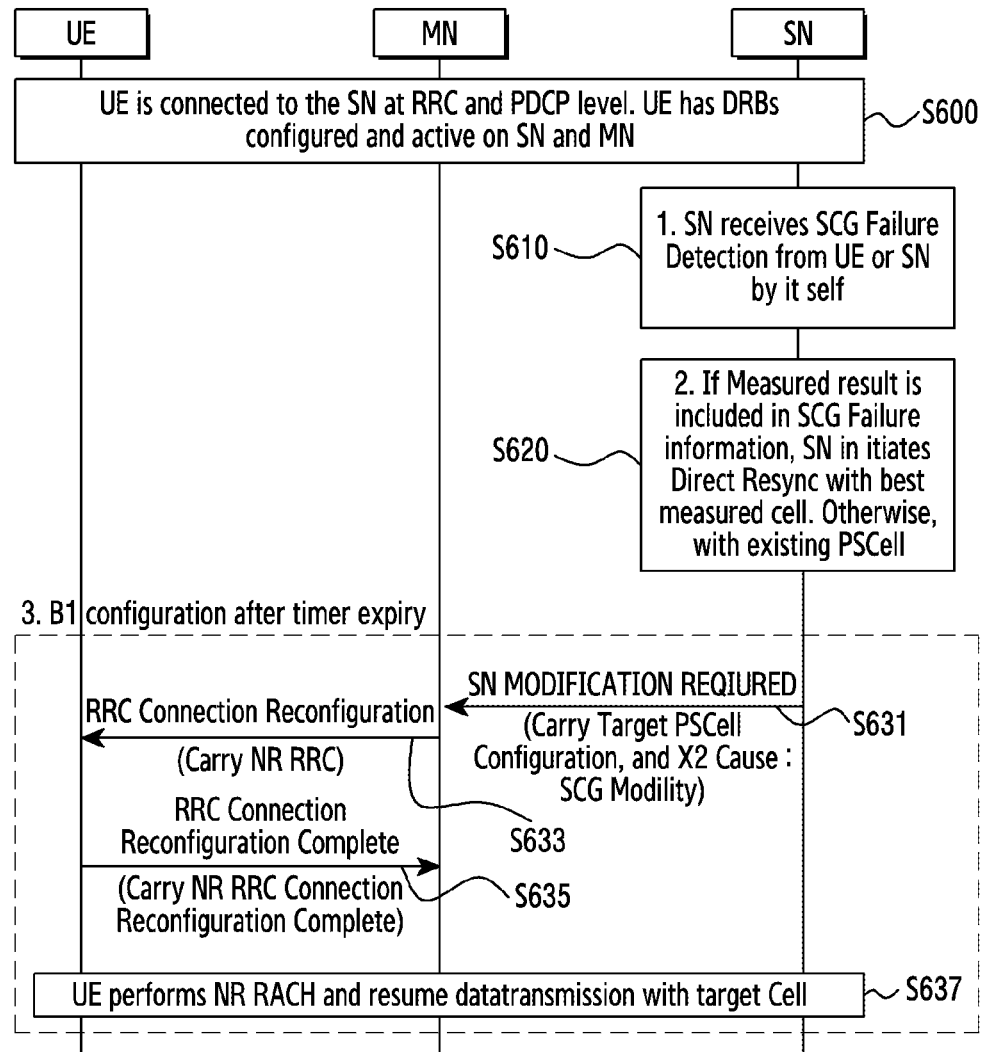
FIG. 6 is a signal flow diagram illustrating an example of signaling for controlling a link failure in a Secondary Node (SN) in a wireless communication system according to various embodiments.

FIG. 6 is a signal flow diagram illustrating an example of signaling for controlling a link failure in a Secondary Node (SN) in a wireless communication system according to various embodiments. In FIG. 6, operations between the MN, SN, and UE, performed by the SN for handling an SCG failure when occurred, are described. It is a situation in which multiple connectivity is achieved in the UE. The UE may be coupled to the MN and the SN. The UE may be coupled to Data Radio Bearers (DRBs) activated in the MN and the SN. The UE may be coupled to the SN at a Radio Resource Control (RRC)/Packet Data Convergence Protocol (PDCP) level.

Referring to FIG. 6, in operation S600, the UE may be coupled to base stations. For example, it is a situation in which multiple connectivity is achieved in the UE. The UE may be coupled to the MN and the SN. The UE may be coupled to DRBs activated in the MN and the SN. The UE may be coupled to the SN at an RRC/PDCP level.

In operation S610, the SN may detect the SCG failure. The SN may detect the SCG failure according to information obtained from the UE, or may autonomously detect whether a specified condition is satisfied or the SCG failure through an input to another node.

In operation S620, the SN may initiate a reconnection procedure. The SN may identify a PSCell for the reconnection. The SN may detect the SCG failure by receiving SCG failure information. In this case, when a measurement result is included in the SCG failure information, the reconnection procedure (direct resync procedure) may be performed. The SN may perform the reconnection procedure with a cell included in a measurement result. That is, a cell identifier for a candidate PSCell may be included in the SCG failure information. Herein, the candidate PSCell may be a cell having the highest channel quality (e.g., a cell having the greatest RSRP) and satisfying a minimum channel quality value among measurement target cells. The SN may initiate the reconnection procedure with the cell having the highest channel quality among the measurement cells. When the SCG failure information is not included in the measurement result, the SN may indicate the reconnection procedure with the existing PSCell.

The SN which has identified the PSCell for the reconnection procedure may perform a connection procedure with the UE through the MN. For example, the MN, the SN, and the UE may perform operations described below.

In operation S631, the SN may transmit an SN modification required message to the MN. The SN modification required message may include X2 cause and configuration information for a target PSCell. The X2 cause may be set to 'SCG Mobility'. In operation S633, the MN may transmit an RRC connection reconfiguration message to the UE. In this case, for the SN (NR base station), in various embodiments, the RRC connection reconfiguration message may include an RRC reconfiguration message for the NR. In operation S635, the UE may transmit an RRC connection reconfiguration complete message to the MN. In this case, for the SN (NR base station), in various embodiments, the RRC connection reconfiguration complete message may include an RRC reconfiguration complete message for the NR.

In operation S637, the MN may transmit an SN modification confirm message to the SN. In operation S639, the UE may perform an access procedure with the SN. The UE may perform the access procedure, based on PSCell information transferred from the SN through the MN. The UE may perform data transmission and reception with the SN in a corresponding PSCell, through an NR RACH procedure and an RRC resume procedure with respect to a corresponding cell.

Although operations of respective nodes are described in detail in FIG. 6 to describe operations between the MN, the SN, and the UE, each process for recovering the SCG failure may operate individually. For example, an inter-node operation of a procedure may be applied as an individual embodiment, and unnecessary operations may be omitted in various embodiments.

In addition, although the operation S637 is described in FIG. 6 as a procedure performed by the MN to establish a connection with the UE, signaling between the MN and the SN may be defined as a specific operation of the MN and SN. For example, the signaling may be illustrated by way of non-limiting example by operations S323 and S325 of FIG. 3, operations S421 to S440 of FIG. 4, and operations S521 to S527 of FIG. 5.

A situation in which the MN is an eNB which is an LTE base station and the SN is a gNB which is an NR base station is described in the disclosure as an EN-DC environment. However, embodiments of the disclosure may be performed also in a different MR-DC environment, similarly to the NR-DC environment e.g., NR-NR. In addition, as a measurement reporting event between two base stations, a B1 event for configuring inter-RAT measurement has been described by way of non-limiting example. The B1 event may be a reporting condition configured to report a measurement result of a neighboring cell having an RAT different from an RAT having channel quality exceeding a threshold. However, this is only an event described for example purposes in the EN-DC situation for convenience of explanation, and embodiments of the disclosure may also be performed through another measurement reporting condition in addition to the B1 event.

Figure 7:
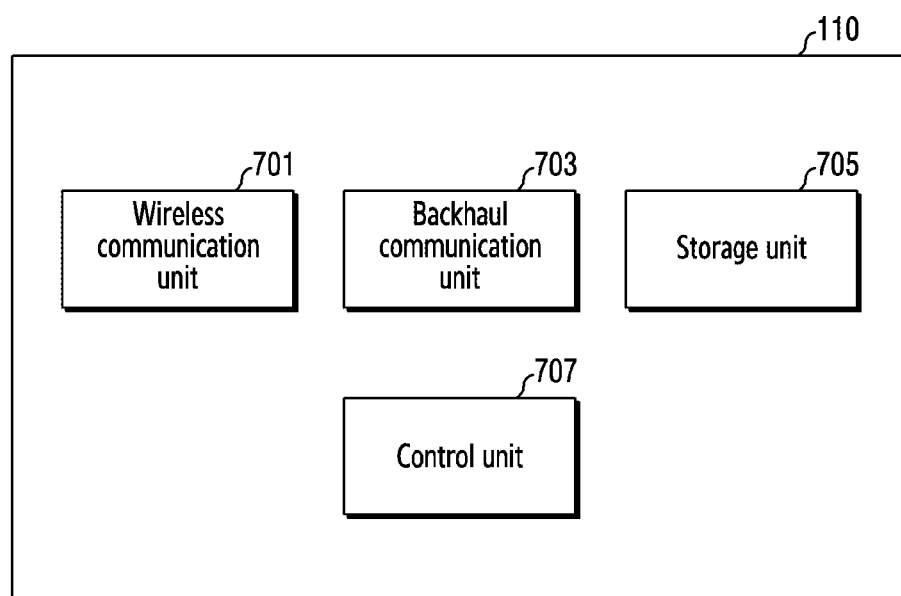
FIG. 7 is a block diagram illustrating an example configuration of a base station in a wireless communication system according to various embodiments.

FIG. 7 is a block diagram illustrating an example configuration of the base station 110 in a wireless communication system according to various embodiments. The example structure of FIG. 7 may be understood as a structure of the base station 110. Hereinafter, the term ' . . . unit', ' . . . device', or the like implies a unit of processing at least one function or operation, and may be implemented in hardware or software or in combination of the hardware and the software.

Referring to FIG. 7, the base station 110 includes a wireless communication unit (e.g., including wireless communication circuitry) 701, a backhaul communication unit (e.g., including various circuitry and/or executable program instructions) 703, a storage unit (e.g., a memory) 705, and a control unit (e.g., including various control circuitry) 707.

The wireless communication unit 701 may include various wireless communication circuitry and performs functions for transmitting and receiving a signal through a radio channel. For example, the wireless communication unit 701 performs a function of conversion between a baseband signal and a bit-stream according to a physical layer standard of a system. For example, in data transmission, the wireless communication unit 701 generates complex symbols by coding and modulating a transmission bit-stream. In addition, in data reception, the wireless communication unit 701 restores a reception bit-stream by demodulating and decoding a baseband signal. In addition, the wireless communication unit 701 up-converts a baseband signal into a Radio Frequency (RF) signal and thereafter transmits it through an antenna, and down-converts an RF signal received through the antenna into a baseband signal.

For this, the wireless communication unit 701 may include a transmission filter, a reception filter, an amplifier, a mixer, an oscillator, a Digital to Analog Converter (DAC), an Analog to Digital Converter (ADC), or the like. In addition, the wireless communication unit 701 may include a plurality of transmission/reception paths. Further, the wireless communication unit 701 may include at least one antenna array constructed of a plurality of antenna elements. From a hardware aspect, the wireless communication unit 701 may be constructed of a digital unit and an analog unit, and the analog unit may be constructed of a plurality of sub-units according to operating power, operation frequency, or the like. According to various embodiments, the wireless communication unit 701 may include a unit of forming a beam, e.g., a beamforming unit. For example, the wireless communication unit 701 may include a Massive MIMO Unit (MMU).

The wireless communication unit 701 may transmit/receive a signal. To this end, the wireless communication unit 701 may include at least one transceiver. For example, the wireless communication unit 701 may transmit a synchronization signal, a reference signal, system information, a message, control information, or data. In addition, the wireless communication unit 701 may perform beamforming. In order to assign a directivity depending on the setting of the control unit 707 to a signal to be transmitted/received, the wireless communication unit 701 may apply a beamforming weight to the signal. According to an embodiment, the wireless communication unit 701 may generate a baseband signal depending on a scheduling result and a transmit power calculation result. In addition, an RF unit in the wireless communication unit 701 may transmit the generated signal through an antenna.

The wireless communication unit 701 transmits and receives a signal as described above. Accordingly, the wireless communication unit 701 may be referred to as a transmitter, a receiver, or a transceiver. In addition, in the following description, transmission and reception performed through a radio channel are used to imply that the aforementioned processing is performed by the wireless communication unit 701.

The backhaul communication unit 703 may include various circuitry and/or executable program instructions and provides an interface for preforming communication with different nodes in a network. For example, the backhaul communication unit 703 converts a bit-stream transmitted from the base station 110 to a different node, e.g., a different access node, a different base station, an upper node, a core network, or the like, into a physical signal, and converts a physical signal received from the different node into a bit-stream. According to various embodiments, the backhaul communication unit 703 may transmit a message to another base station (e.g., any SN). In various embodiments, the message may include an SN modification request message and a response message for this. The message may include an SN modification required message and a response message for this. In addition, the message may include cell information. In various embodiments, the message may include information on a currently operating cell (e.g., current PSCell information). In addition, in various embodiments, the cell information may include information on a target cell for reconnection. The target cell for the reconnection may be a PSCell candidate cell. The cell information may indicate a cell in the form of a Cell Global Identifier (CGI). For example, the message may include NR-CGI to indicate a candidate cell of a target PSCell of an NR base station.

The storage unit 705 may include, for example, a memory and stores data such as a basic program, application program, configuration information, or the like for an operation of the base station 110. The storage unit 705 may include a memory. The storage unit 705 may be constructed of a volatile memory, a non-volatile memory, or a combination of the volatile memory and the non-volatile memory. In addition, the storage unit 705 may provide the stored data according to a request of the control unit 707.

The control unit 707 may include various processing or control circuitry and controls overall operations of the base station 110. For example, the control unit 707 may transmit and receive a signal via the communication unit 701 or the backhaul communication unit 703. Further, the control unit 707 writes and reads data in the storage unit 705. In addition, the control unit 707 may perform functions of a protocol stack required in a communication specification. To this end, the control unit 707 may include at least one processor. In various embodiments, the control unit 707 may perform an operation of the MN or SN. The control unit 707 may detect RLF occurrence in a cell. The control unit 707 may detect a failure of a cell group. The control unit 707 may configure inter-RAT measurement. The control unit 707 may control enrollment/release of a blacklist. The control unit 707 may initiate a timer, or may detect an end of the timer. A component for each operation of the control unit 707 may be commands/codes resided in the control unit 707 at least temporarily or a storage space storing the commands/codes, or may be part of a circuity of the control unit 707. Meanwhile, according to another embodiment, a scheduler and a transmit power calculation unit may be independently implemented in individual devices. According to various embodiments, the control unit 707 may control the base station 110 to perform operations based on various embodiments to be described below.

The structure of the base station 110 illustrated in FIG. 7 is simply an example of a base station, and the example of the base station performing various embodiments of the disclosure is not limited to the structure illustrated in FIG. 7. For example, the structure may be added, deleted, or changed in part according to various embodiments.

Although the base station is described as one entity in FIG. 7, the disclosure is not limited thereto. The base station according to various embodiments of the disclosure may be implemented as an access network having not only an integrated deployment but also a distributed deployment. According to an embodiment, the base station may be divided into a Central Unit (CU) and a Digital Unit (DU). The CU may be implemented to perform functions of upper layers (e.g., Packet Data Convergence Protocol (RRC)), and the DU may be implemented to perform functions of lower layers (e.g., Medium Access Control (MAC), and Physical (PHY)). The DU of the base station may include beam coverage on a radio channel.

Figure 8:
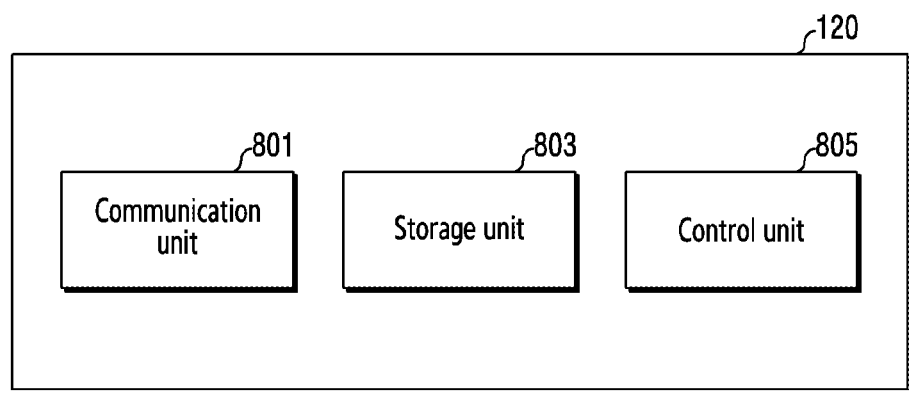
FIG. 8 is a block diagram illustrating an example configuration of a terminal in a wireless communication system according to various embodiments.

FIG. 8 is a block diagram illustrating an example configuration of a UE in a wireless communication system according to various embodiments. The example structure of FIG. 8 may be understood as a structure of the UE 120. Hereinafter, the term '. . . unit', '. . . device', or the like implies a unit of processing at least one function or operation, and may be implemented in hardware or software or in combination of the hardware and the software.

Referring to FIG. 8, the UE 120 includes a communication unit (e.g., including communication circuitry) 801, a storage unit (e.g., including a memory) 803, and a control unit (e.g., including processing or control circuitry) 805.

The communication unit 801 may include various communication circuitry and performs functions for transmitting and receiving a signal through a radio channel. For example, the communication unit 801 performs a function of conversion between a baseband signal and a bit-stream according to a physical layer standard of a system. For example, in data transmission, the communication unit 801 generates complex symbols by coding and modulating a transmission bit-stream. In addition, in data reception, the communication unit 801 restores a reception bit-stream by demodulating and decoding a baseband signal. In addition, the communication unit 801 up-converts a baseband signal into an RF signal and thereafter transmits it through an antenna, and down-converts an RF signal received through the antenna into a baseband signal. For example, the communication unit 801 may include a transmission filter, a reception filter, an amplifier, a mixer, an oscillator, a DAC, an ADC, or the like.

In addition, the communication unit 801 may include a plurality of transmission/reception paths. Further, the communication unit 801 may include an antenna unit. The communication unit 801 may include at least one antenna array constructed of a plurality of antenna elements. From a hardware aspect, the communication unit 801 may be constructed of a digital circuit and an analog circuit (e.g., a Radio Frequency Integrated Circuit (RFIC)). Herein, the digital circuit and the analog circuit may be implemented as one package. In addition, the communication unit 801 may include a plurality of RF chains. In addition, the communication unit 801 may perform beamforming. In order to assign a directivity depending on the setting of the control unit 805 to a signal to be transmitted/received, the communication unit 801 may apply a beamforming weight to the signal. According to an embodiment, the communication unit 801 may include a Radio Frequency (RF) block (or RF unit). The RF block may include a first RF circuitry related to the antenna and a second RF circuitry related to baseband processing. The first RF circuitry may be referred to as RF-Antenna (RF-A). The second RF circuitry may be referred to as RF-Baseband (RF-B).

In addition, the communication unit 801 may transmit/receive a signal. To this end, the communication unit 801 may include at least one transceiver. The communication unit 801 may receive a downlink signal. The downlink signal may include a Synchronization Signal (SS), a Reference Signal (RS) (e.g., Cell-specific Reference Signal (CRS), Demodulation (DM)-RS), system information (e.g., MIB, SIB, Remaining System Information (RMSI), Other System Information (OSI)), a configuration message, control information, or downlink data, etc. In addition, the communication unit 801 may transmit an uplink signal. The uplink signal may include a random access-related signal (e.g., Random Access Preamble (RAP) (Message 1 (Msg1), message 3 (Msg3))), a reference signal (e.g., Sounding Reference Signal (SRS), DM-RS), or a Power Headroom Report (PHR), etc.

In addition, the communication unit 801 may include different communication modules to process signals of different frequency bands. Further, the communication unit 801 may include a plurality of communication modules to support a plurality of different radio access technologies. For example, the different radio access technologies may include a Bluetooth Low Energy (BLE), a Wireless Fidelity (WiFi), a WiFi Gigabyte (WiGig), a cellular network (e.g., Long Term Evolution (LTE), New Radio (NR)), or the like. In addition, the different frequency bands may include a Super High Frequency (SHF) (e.g., 2.5 GHz, 5 GHz) band and a millimeter wave (e.g., 38 GHz, 60 GHz, etc.) band. In addition, the communication unit 801 may use the same-type radio access technology on different frequency bands (e.g., an unlicensed band for Licensed Assisted Access (LAA), Citizens Broadband Radio Service (CBRS) (e.g., 3.5 GHz)).

The communication unit 801 transmits and receives a signal as described above. Accordingly, the communication unit 801 may be referred to as a transmitter, a receiver, or a transceiver. In addition, in the following description, transmission and reception performed through a radio channel are used to imply that the aforementioned processing is performed by the communication unit 801.

The storage unit 803 may include a memory and stores data such as a basic program, application program, configuration information, or the like for an operation of the UE 120. The storage unit 803 may be constructed of a volatile memory, a non-volatile memory, or a combination of the volatile memory and the non-volatile memory. In addition, the storage unit 803 may provide the stored data according to a request of the control unit 805. According to various embodiments, the storage unit 803 may store each beam of a beam set to be operated in the UE 120 or direction information on each beam of an auxiliary beam pair.

The control unit 805 may include various processing or control circuitry and controls overall operations of the UE 120. For example, the control unit 805 may transmit and receive a signal via the communication unit 801. Further, the control unit 805 writes and reads data in the storage unit 803. In addition, the control unit 805 may perform functions of a protocol stack required in a communication specification. To this end, the control unit 805 may include at least one processor. The control unit 805 may include at least one processor or micro-processor, or may be part of the processor. In addition, part of the communication unit 801 and the control unit 805 may be referred to as a CP. The control unit 805 may include various modules for performing communication. According to various embodiments, the control unit 805 may control the UE to perform operations based on various embodiments described above. The control unit 805 may detect RLF occurrence in a cell. The control unit 805 may perform measurement. The control unit 805 may detect whether a measurement report condition is satisfied. The control unit 805 may perform measurement reporting including a measurement result. The control unit 805 may perform an access procedure with a cell. The control unit 805 may perform measurement.

Even if an RLF occurs in a Secondary Node (SN) while operating dual connectivity between heterogeneous or homogeneous RATs in a UE through a procedure of measurement reporting and signaling between an MN and the SN, a timer operation, or the like, a recovery and reconnection procedure for this may be configured. According to these procedures, since effective failure management is possible through a handling operation for the existing cell and bearer under the control of a base station, improved performance may be expected compared to the conventional technique.

Various embodiments of the disclosure may be applied to Multi Radio Dual-Connectivity (MR-DC) including: Evolved universal terrestrial radio access-New radio Dual-Connectivity (EN-DC) in which a connection is established to a 4G core network between a 4G primary cell group and a 5G secondary cell group defined in the 3GPP standard; NG-RAN Evolved universal terrestrial radio access-New radio Dual-Connectivity (NGEN-DC) in which a connection is established to a 5G core network between the 4G primary cell group and the 5G secondary cell group; New radio-Evolved universal terrestrial radio access Dual-Connectivity (NE-DC) in which a connection is established to the 5G core network between a 4G secondary cell group and a 5G primary cell group; and Multi Radio Dual-Connectivity (MR-DC) in which a connection is established between a 5G cell group and another 5G cell group.

A method of operating a base station in which a Master Cell Group (MCG) is configured in a wireless communication system according to an example embodiment of the disclosure may include: detecting a failure of a Primary Cell (PCell) of a Secondary Cell Group (SCG) (PScell), transmitting inter-Radio Access Technology (RAT) measurement configuration information to a terminal based on the detection, and transmitting information on a cell identified based on the measurement configuration information to a base station in which the SCG is configured.

In an example embodiment, the information on the identified cell may include information on at least one cell, information on a measurement result depending on the measurement configuration information, and X2 cause information.

In an example embodiment, the detecting may include receiving information on the SCG failure from the terminal or the base station in which the SCG is configured.

In an example embodiment, the method may further include receiving a measurement report for the measurement configuration information from the terminal, and identifying a cell, based on the measurement report.

In an example embodiment, the method may further include receiving information related to a resuming procedure from the base station in which the SCG is configured. The information related to the resuming procedure may include an Identifier (ID) of the PSCell or an X2 Cause.

In an example embodiment, the method may further include transmitting a message including removal of the measurement configuration information to the terminal based on the information related to the resuming procedure.

In an example embodiment, the method may further include receiving a response for the message including the removal of the measurement configuration information from the terminal, and transmitting a modification confirm message to the base station in which the SCG is configured, based on the response.

A base station in which a Master Cell Group (MCG) is configured in a wireless communication system according to an embodiment may include: at least one transceiver, and at least one processor. The at least one processor may be configured to: detect a failure of a Primary Cell (PCell) of a Secondary Cell Group (SCG) (PScell), transmit inter-radio access technology (RAT) measurement configuration information to a terminal, based on the detection, and transmit information on a cell identified based on the measurement configuration information to a base station in which the SCG is configured.

In an example embodiment, the information on the identified cell may include information on at least one cell, information on a measurement result depending on the measurement configuration information, and X2 cause information.

In an example embodiment, the at least one processor may be configured to receive information on the SCG failure from the terminal or the base station in which the SCG is configured.

In an example embodiment, the at least one processor may be configured to receive a measurement report for the measurement configuration information from the terminal, and identify a cell, based on the measurement report.

In an example embodiment, the at least one processor may be configured to receive information related to a resuming procedure from the base station in which the SCG is configured. The information related to the resuming procedure may include an ID of the PSCell or an X2 cause.

In an example embodiment, the at least one processor may be configured to control the base station to transmit a message including removal of the measurement configuration information to the terminal, based on the information related to the resuming procedure.

In an example embodiment, the at least one processor may be configured to receive a response for the message including the removal of the measurement configuration information from the terminal, and control the base station to transmit a modification confirm message to the base station in which the SCG is configured, based on the response.

A method of operating a base station in which a secondary cell group (SCG) is configured in a wireless communication system may include: detecting a failure of a Primary Cell (PCell) of a Secondary Cell Group (SCG) (PScell), identifying a cell, based on the detection, and performing a connection procedure with a terminal by transmitting information on the cell to a base station in which a master cell group (MCG) is configured.

A base station in which a secondary cell group (SCG) is configured in a wireless communication system according to an example embodiment of the disclosure may include: at least one transceiver, and at least one processor. The at least one processor may be configured to: detect a failure of a Primary Cell (PCell) of a Secondary Cell Group (SCG) (PScell), identify a cell, based on the detection, and perform a connection procedure with a terminal by transmitting information on the cell to a base station in which a master cell group (MCG) is configured.

In addition, although an expression 'greater than' or 'less than' is used in the disclosure to determine whether a specific condition is satisfied (or fulfilled), this is for example purposes and does not exclude an expression of 'greater than or equal to' or 'less than or equal to'. A condition described as "greater than or equal to" may be replaced with "greater than". A condition described as "less than or equal to" may be replaced with "less than". A condition described as "greater than or equal to and less than" may be replaced with "greater than and less than or equal to".

Methods based on the embodiments disclosed in the claims and/or the disclosure may be implemented in hardware, software, or a combination of both.

When implemented in software, computer readable recording medium for storing one or more programs (e.g., software modules) may be provided. The one or more programs stored in the computer readable recording medium are configured for execution performed by one or more processors in the electronic device. The one or more programs include instructions for allowing the electronic device to execute the methods disclosed.

The program (e.g., the software module or software) may be stored in a random access memory, a non-volatile memory including a flash memory, a Read Only Memory (ROM), an Electrically Erasable Programmable Read Only Memory (EEPROM), a magnetic disc storage device, a Compact Disc-ROM (CD-ROM), Digital Versatile Discs (DVDs) or other forms of optical storage devices, and a magnetic cassette. The program may be stored in a memory configured in combination of all or some of these storage media. In addition, the configured memory may be plural in number.

Further, the program may be stored in an attachable storage device capable of accessing the electronic device through a communication network such as the Internet, an Intranet, a Local Area Network (LAN), a Wide LAN (WLAN), or a Storage Area Network (SAN) or a communication network configured by combining the networks. The storage device may have access to a device for performing an embodiment of the disclosure via an external port. In addition, an additional storage device on a communication network may have access to the device for performing the embodiment of the disclosure.

In the aforementioned various example embodiments of the disclosure, a component included in the disclosure is expressed in a singular or plural form according to various example embodiments herein. However, the singular or plural expression is selected properly for a situation for the convenience of explanation, and thus the various embodiments of the disclosure are not limited to a single or a plurality of components. Therefore, a component expressed in a plural form may also be expressed in a singular form, or vice versa.

While the disclosure has been illustrated and described with reference to various example embodiments thereof, it will be understood that the various example embodiments are intended to be illustrative, not limiting. It will be further understood by those skilled in the art that various changes in form and detail may be made without departing from the true spirit and full scope of the disclosure including the appended claims and their equivalents. It will also be understood that any of the embodiment(s) described herein may be used in conjunction with any other embodiment(s) described herein.

What is claimed is:

1. A method performed by a first base station in which a Master Cell Group-(MCG) is configured in a wireless communication system, the method comprising:
   receiving, from a user equipment (UE), secondary cell group (SCG) failure information associated with a SCG;
   transmitting, to a second base station in which athe SCG is configured, a first secondary node modification request message which comprises the SCG failure information including a SCG failure cause;
   receiving, from the second base station, a secondary node modification acknowledge message;
   transmitting, to the UE, a first radio resource control (RRC) connection reconfiguration message; including configuration information for a measurement of the UE for SCG resume,
   receiving, from the UE, a measurement report based on the configuration information for the measurement;
   transmitting, to the second base station, a second secondary node modification request message including information on a candidate cell list and a measurement result based on the measurement report;
   receiving, from the second base station, a message including information on a target cell associated with the SCG resume with the UE; and
   transmitting, to the UE, a second RRC connection reconfiguration message including information on a removal of the measurement.

2. The method of claim 1, wherein the secondary node modification acknowledge message includes information for path information.

3. The method of claim 1, further comprising:
   receiving, from the UE, RRC connection reconfiguration complete message; and
   transmitting, to the second base station, a secondary node reconfiguration complete message.

4. The method of claim 1,
   wherein the first base station is an eNodeB (eNB) and the second base station is a gNodeB (gNB), or wherein the first base station is the gNB, and the second base station is the eNB, or wherein the first base station is the gNB, and the second base station is the gNB.

5. A first base station in which a Master Cell Group (MCG) is configured in a wireless communication system, comprising:
- at least one transceiver; and
- at least one processor, comprising processor circuitry, coupled to the at least one transceiver,
- wherein the at least one processor is configured to:
  - receive, from a user equipment (UE), secondary cell group (SCG) failure information associated with a SCG;
  - transmit, to a second base station in which athe SCG is configured, a first secondary node modification request message which comprises the SCG failure information including a SCG failure cause;
  - receive, from the second base station, a secondary node modification acknowledge message;
  - transmit, to the UE, a first radio resource control (RRC) connection reconfiguration message; including configuration information for a measurement of the UE for SCG resume,
  - receive, from the UE, a measurement report based on the configuration information for the measurement;
  - transmit, to the second base station, a second secondary node modification request message including information on a candidate cell list and a measurement result based on the measurement report;
  - receive, from the second base station, a message including information on a target cell associated with the SCG resume with the UE; and
  - transmit, to the UE, a second RRC connection reconfiguration message including information on a removal of the measurement.

6. The first base station of claim 5, wherein the secondary node modification acknowledge message includes configuration information for path information.

7. The first base station of claim 5, wherein the at least one processor is further configured to:
- receive, from the UE, RRC connection reconfiguration complete message; and
- transmit, to the second base station, a secondary node reconfiguration complete message.

8. The first base station of claim 5,
wherein the first base station is an eNodeB (eNB) and the second base station is a gNodeB (gNB), or
wherein the first base station is the gNB, and the second base station is the eNB, or
wherein the first base station is the gNB, and the second base station is the gNB.

* * * * *